(12) United States Patent  
Montgomery et al.

(10) Patent No.: US 7,208,249 B2  
(45) Date of Patent: Apr. 24, 2007

(54) METHOD OF PRODUCING A PATTERNED PHOTORESIST USED TO PREPARE HIGH PERFORMANCE PHOTOMASKS

(75) Inventors: Melvin Warren Montgomery, Camas, WA (US); Alex Buxbaum, Portland, OR (US); Scott Edward Fuller, Portland, OR (US); Cecilia Annette Montgomery, Camas, WA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/261,972

(22) Filed: Sep. 30, 2002

(65) Prior Publication Data

US 2004/0063003 A1    Apr. 1, 2004

(51) Int. Cl.  
*G03F 9/00* (2006.01)  
*G03F 7/30* (2006.01)

(52) U.S. Cl. .......................... 430/5; 430/326; 430/330
(58) Field of Classification Search ............ 430/270.1, 430/905, 910, 5, 326, 330  
See application file for complete search history.

(56) References Cited

U.S. PATENT DOCUMENTS

| | | | | |
|---|---|---|---|---|
| 4,837,124 A | * | 6/1989 | Wu et al. ................ | 430/270.1 |
| 5,939,236 A | | 8/1999 | Pavelchek et al. ........ | 430/273.1 |
| 5,962,180 A | * | 10/1999 | Iwanaga et al. ............ | 430/170 |
| 5,976,770 A | | 11/1999 | Sinta et al. ................. | 430/325 |
| 5,998,092 A | | 12/1999 | McCulloch et al. ...... | 430/270.1 |
| 6,037,107 A | | 3/2000 | Thackeray et al. ......... | 430/326 |
| 6,077,643 A | | 6/2000 | Kumar et al. ............. | 430/270.1 |
| 6,114,085 A | | 9/2000 | Padmanaban et al. ... | 430/270.1 |
| 6,203,965 B1 | | 3/2001 | Cameron et al. ........ | 430/270.1 |
| 6,235,446 B1 | * | 5/2001 | Ikemura et al. .......... | 430/270.1 |
| 6,261,743 B1 | | 7/2001 | Pavelchek et al. .......... | 430/325 |
| 6,280,911 B1 | | 8/2001 | Trefonas, III ............... | 430/326 |
| 6,365,321 B1 | * | 4/2002 | Chen et al. .............. | 430/270.1 |
| 6,365,322 B1 | | 4/2002 | Padmanaban et al. ... | 430/270.1 |
| 6,605,394 B2 | * | 8/2003 | Montgomery et al. ......... | 430/5 |
| 2002/0012875 A1 | | 1/2002 | Pavelchek et al. ....... | 430/270.1 |
| 2002/0182514 A1 | * | 12/2002 | Montgomery et al. ......... | 430/5 |

FOREIGN PATENT DOCUMENTS

EP        1020768 A1    7/2000

OTHER PUBLICATIONS

H. Ito, "Chemical amplification resists: Histor development withing IBM." IBM Journal of Research and Development, vol. 41. Nos. 1/2 (1997) pp. 1-8.

Presently pending patent application: Scott Fuller, et al., "Method of Preparing Optically Imaged High Performance Photomasks." U.S. Appl. No. 09/912,116, filed on Jul. 23, 2001.

Presently pending patent application: Melvin W. Montgomery et al., "Organic Bottom Antireflective Coating for High Performance Mask Making Using Optical Imaging." U.S. Appl. No. 09/848,859, filed on May 3, 2001.

Presently pending patent application: Melvin W. Montgomery et al., "Method of Extending the Stability of a Photoresist During Direct Writing of an Image Upon the Photoresist." U.S. Appl. No. 09/990,684, filed on Nov. 21, 2001.

* cited by examiner

*Primary Examiner*—John S. Chu  
(74) *Attorney, Agent, or Firm*—Shirley L. Church

(57) ABSTRACT

We are able to significantly reduce variations in critical dimension from target for features in a patterned photoresist, where the patterned photoresist is generated during the fabrication of a reticle (photomask) to be used in semiconductor processing. The ability to maintain the targeted critical dimension of patterned photoresist features which were imaged using a direct write process depends upon the use of a photoresist binder resin system which provides a sufficiently dense structure to sterically hinder the movement of photoacid-labile groups after irradiation of such groups (writing of the pattern). As importantly, the photoacid groups which are used to generate the pattern need to be such that they are activated only at temperatures above about 70° C., and preferably at temperatures in the range of 110° C. to 150° C. Further improvement in uniformity of developed photoresist feature size across the reticle surface is achieved by controlling a combination of variables during development.

18 Claims, 8 Drawing Sheets

■ F1 No Surfactant
▲ F2 Surfactant

METHOD OF PRODUCING A PATTERNED PHOTORESIST USED TO PREPARE HIGH PERFORMANCE PHOTOMASKS

FIELD OF THE INVENTION

In general, the present invention relates to a method of producing a lithographic mask (reticle) for use in the semiconductor industry. In particular, the invention pertains to a method of producing a patterned photoresist used in preparation of the reticle. The optical imaging of the photoresist makes use of a deep ultraviolet (DUV) radiation. The DUV photoresist is imaged using an optical direct write continuous laser mask writing tool.

BRIEF DESCRIPTION OF THE BACKGROUND ART

Photoresist compositions are used in microlithographic processes for making miniaturized electronic components, such as in the fabrication of semiconductor device structures. The miniaturized electronic device structure patterns are typically created by transferring a pattern from a patterned masking layer overlying the semiconductor substrate, rather than by direct write on the semiconductor substrate, because of the time economy which can be achieved by blanket processing through a patterned masking layer. With regard to semiconductor device processing, the patterned masking layer may be a patterned photoresist layer or may be a patterned "hard" masking layer (typically an inorganic material or a high temperature organic material) which resides on the surface of the semiconductor device structure to be patterned. The patterned masking layer is typically created using another mask which is frequently referred to as a photomask or reticle. A reticle is typically a thin layer of a metal-containing layer (such as a chrome-containing, molybdenum-containing, or tungsten-containing material, for example) deposited on a glass or quartz plate. The reticle is patterned to contain a "hard copy" of the individual device structure pattern to be recreated on the masking layer overlying a semiconductor structure.

A reticle may be created by a number of different techniques, depending on the method of writing the pattern on the reticle. Due to the dimensional requirements of today's semiconductor structures, the writing method is generally with a laser or e-beam. A typical process for forming a reticle may include: providing a glass or quartz plate, depositing a chrome-containing layer on the glass or quartz surface, depositing an antireflective coating (ARC) over the chrome-containing layer, applying a photoresist layer over the ARC layer, direct writing on the photoresist layer to form a desired pattern, developing the pattern in the photoresist layer, etching the pattern into the chrome layer, and removing the residual photoresist layer. When the area of the photoresist layer contacted by the writing radiation becomes easier to remove during development, the photoresist is referred to as a positive-working photoresist. When the area of the photoresist layer contacted by the writing radiation becomes more difficult to remove during development, the photoresist is referred to as a negative-working photoresist. Advanced reticle manufacturing materials frequently include combinations of layers of materials selected from chromium, chromium oxide, chromium oxynitride, molybdenum, molybdenum silicide, and molybdenum tungsten silicide, for example.

As previously mentioned, the reticle or photomask is used to transfer a pattern to an underlying photoresist, where the reticle is exposed to blanket radiation which passes through open areas of the reticle onto the surface of the photoresist. The photoresist is then developed and used to transfer the pattern to an underlying semiconductor structure. Due to present day pattern dimensional requirements, which are commonly less than 0.3 µm, the photoresist is preferably a chemically amplified DUV photoresist. In the making of the reticle itself, a chemically amplified DUV photoresist has been used in combination with a direct write electron beam writing tool. Additional work has been done recently using a direct write continuous wave laser tool available under the trade name ALTA™ from ETEC Systems Inc., Hillsboro, Oreg.

Preparation of a photomask/reticle is a complicated process involving a number of interrelated steps which affect the critical dimensions of a pattern produced in the reticle, and the uniformity of the pattern critical dimensions across the surface area of the reticle. By changing various steps in the reticle manufacturing process, the reproducibility of the manufacturing process itself may be altered, including the processing window. Processing window refers to the amount process conditions can be varied without having a detrimental outcome on the product produced. The larger the processing window, the greater change permitted in processing conditions without a detrimental affect on the product. Thus, a larger process window is desirable, as this generally results in a higher yield of in specification product produced.

The reticle manufacturing process steps generally include the following, where the initial substrate used to form the reticle is a silicon oxide-containing base layer having a layer of a metal-containing (typically chrome) mask material applied thereover. An inorganic antireflective coating (ARC) or an organic ARC, or a combination of inorganic and organic ARC layers may be applied over the surface of the chrome mask material. A photoresist layer is then applied over the antireflective coating. The photoresist is typically an organic material which is dissolved or dispersed in a solvent. The solution or dispersion of photoresist is typically spin coated onto the surface of the photomask fabrication structure. Typically, the photoresist is applied over an ARC layer on the fabrication structure surface. Some of the solvent or dispersion medium is removed during the spin coating operation. Residual solvent or dispersion medium is subsequently removed by another means, typically by baking the fabrication structure, including the photoresist layer. This step is commonly referred to as "Post Apply Bake" or PAB. The photoresist is then exposed to radiation (imaged), to produce a pattern in the photoresist layer, typically by a direct write process when the pattern includes dimensions which are less than about 0.3 µm. After exposure, the substrate including the photoresist layer is baked again. The second baking is typically referred to as "Post Exposure Bake" or PEB. The photoresist is then developed either using a dry process or a wet process, to create the pattern having openings through the photoresist layer thickness. Once the photoresist is "patterned" so that the pattern openings extend through the photoresist layer to the upper surface of an ARC layer, or to a surface beneath an ARC layer, the pattern in the patterned photoresist is transferred through the chrome-based mask layer and any remaining layers overlying the chrome layer, for example, typically by dry etching.

U.S. Pat. No. 6,303,169, issued Mar. 9, 2004 to Fuller et al., titled: "Method Of Preparing Optically Imaged High Performance Photomasks", and assigned to the assignee of the present invention, describes a method of producing a reticle via an optically imaged photoresist using a direct write continuous wave laser. In particular, the invention pertains to a method of optically fabricating a photomask using a direct write continuous wave laser, which includes the steps of applying an organic antireflection coating over a metal-containing layer; applying a chemically-amplified DUV photoresist, either positive tone or negative tone, over the organic antireflection coating; baking the DUV photoresist at a temperature within a specifically designed range under ambient conditions, with volatile removal assisted by an exhaust hood fan or by similar method (PAB); exposing a surface of the DUV photoresist to radiation from the direct write continuous wave laser; baking the developed photoresist at a temperature within a specifically designed range, again under ambient conditions using an exhausted hot plate (PEB); and, developing the image within the DUV photoresist. Preferably the laser used to image the DUV photoresist is operated at 244 or 257 nm, although other wavelengths may be used. Subsequently, the developed, patterned photoresist is used as a mask for transferring the pattern through a metal-containing layer of the photomask substrate. Typically the pattern transfer is by dry etch. The metal-containing layer of the photomask substrate may include combinations of layers of materials selected from chromium, chromium oxide, chromium oxynitride, molybdenum, molybdenum silicide, and molybdenum tungsten silicide, for example and not by way of limitation. This patent is hereby incorporated by reference in its entirety.

U.S. Pat. No. 6,605,394, issued Aug. 12, 2003 to Montgomery et al., titled: "Organic Bottom Antireflective Coating For High Performance Mask Making Using Optical Imaging", and assigned to the assignee of the present invention, also describes a reticle fabrication process, with emphasis on the bottom ARC layers used beneath the photoresist, during patterning of the photoresist. One embodiment of the invention pertains to a method of optically fabricating a photomask using a direct write continuous wave laser, which includes the steps of applying an organic antireflection coating over a metal-containing layer; applying a chemically-amplified DUV photoresist, either positive tone or negative tone, over the organic antireflection coating; and exposing a surface of the DUV photoresist to radiation from the direct write continuous wave laser. Preferably the laser is operated at 244 nm or 257 nm. The metal-containing layer may include combinations of layers of materials selected from chromium, chromium oxide, chromium oxynitride, molybdenum, molybdenum silicide, and molybdenum tungsten silicide, for example and not by way of limitation. The organic antireflection coating may be selected from a negative photoresist containing a DUV dye; a polymeric material prepared from acrylic polymers or copolymers; a binder resin combined with an acid or thermal acid generator and a photoacid generator compound; a binder resin having pendent phenyl groups; and combinations thereof. The organic anti-reflective coating composition preferably comprises acrylic polymers and/or copolymers. In an alternative embodiment of the method of fabricating a photomask, the organic antireflection-coating is applied over an inorganic antireflection coating. The inorganic antireflection coating may be selected to include a material such as chrome oxynitride, titanium nitride, silicon nitride or molybdenum silicide. The '394 patent describes a reticle fabrication process which employs a new direct pattern writing tool which is a 244 nm or a 257 nm mask writing laser available from ETEC Systems Inc., Hillsboro, Oreg. This patent is hereby incorporated by reference in its entirety. Additional information about process variables in the 257 nm direct writing of photomask patterns is provided in U.S. Pat. No. 6,703,169, referenced above.

As disclosed in the '394 patent, there are a number of problems encountered in trying to produce a photomask/reticle when the photomask pattern exhibits critical dimensions of less than 0.3 μm. Further, producing a reticle where pattern critical dimensions are uniform across the entire reticle surface requires careful control of process variables in each step of the reticle manufacturing process.

U.S. Pat. No. 6,727,047 issued Apr. 27, 2004 to Montgomery et al., titled: "Method Of Extending The Stability Of A Photoresist During Direct Writing Of An Image Upon The Photoresists", and assigned to the assignee of the present invention, describes a method of reducing the environmental sensitivity of a chemically amplified photoresist This improves the process window during imaging and development of the chemically amplified photoresist. The photoresist is overcoated with a thin coating (topcoat) of a protective but transmissive material. It is particularly helpful if the topcoat material exhibits a refractive index and thickness which is matched to the refractive index and thickness of the photoresist. In addition, to provide improved stability when the time period required for direct writing of a pattern on the photoresist is a long time, in excess of about 2 hours, for example, the topcoat is pH adjusted to be as neutral in pH as possible, depending on other process variable requirements. By application of a pH adjusted protective topcoat, described above, over a chemically amplified photoresist, it is possible to prepare an unexposed photoresist-coated substrate (wafer or reticle) months before its actual exposure to radiation, and to maintain the substrate in a patterning (radiation imaging) tool for longer time periods. U.S. Pat. No. 6,727,047 is hereby incorporated by reference in its entirety.

The disadvantage of using a topcoat is that the topcoat may gradually disperse into the underlying chemically amplified photoresist and affect the performance of the chemically amplified photoresist, depending on the composition of the particular photoresist.

The chemically amplified photoresist used during development of the experimental data provided in U.S. Pat. Nos. 6,703,169; 6,605,394; and 6,727,047 was generally for a chemically amplified DUV photoresist, DX1100 supplied by AZ-Clariant Corp. of Somerville, N.J. This photoresist comprises a modified phenolic polymer; propylene glycol monomethyl ether acetate (PGMEA); 1-methoxy-2-propyl acetate; and, an onium salt metal halide complex as a chemical amplifier.

During more recent development of the reticle manufacturing process, we worked to reduce the minimum feature size which could be imaged (printed) using the optical imaging direct write continuous wave laser described above. In addition, we made a major effort to improve the uniformity of the critical dimension of a feature size across the entire reticle surface.

The present invention pertains to improving the reticle processing window in a manner which enables patterning of smaller dimension features and which enables better uniformity of features across the reticle. In particular, the invention relates to an improvement in photoresist behavior during the pattern irradiation (frequently referred to as imaging or printing) of a chemically amplified positive photoresist and during pattern development of the positive photoresist.

SUMMARY OF THE INVENTION

We are able to significantly reduce critical dimension variations from target for features in a patterned photoresist, where the patterned photoresist is generated during the fabrication of a reticle (photomask) to be used in semiconductor processing. The method of maintaining the targeted critical dimension during the patterning of photoresist features is particularly useful when the photoresist is imaged using a direct write process. The method depends upon the use of a photoresist binder resin system which provides a sufficiently dense structure to sterically hinder the movement of photoacid-labile groups after irradiation of such groups (writing of the pattern). As importantly, the photoacid groups which are used to generate the pattern need to be such that they are activated only at temperatures above about 70° C., and preferably at temperatures in the range of 110° C. to 150° C. We have discovered that we are able to significantly reduce the change in critical dimension of features in a patterned photoresist where the direct write process requires a time period greater than about 2 hours. The steric hinderance by the photoresist polymeric binder resin and the inactivity of irradiated photoacid groups needs to be present at temperatures the photoresist experiences during writing of a pattern on the photoresist surface (printing) and during storage or handling of the irradiated (printed) photoresist prior to post exposure bake (PEB). For example, we have been able to reduce the global variation across a 6 in square reticle plate to less than 10 nm by selecting a photoresist having an advantageous composition. In addition, this steric hinderance helps provide better uniformity of feature size across the surface area of the reticle. In particular, the chemically amplified photoresist composition should include a polymeric binder comprising repeat units which can be packed closely together to provide maximum density.

Examples of such closely packing polymeric binders include polymers containing hydroxy phenyl and aromatic acrylic repeating units. The hydroxy phenyl repeating units may be meta, para, or ortho hydroxystyrene, for example. These hydroxy phenyl repeating units may be in combination with acrylate repeating units. An alkyl acrylate phenol polymer works particularly well. One example polymeric binder comprises hydroxy styrene, styrene, and t-butyl acrylate. Another example polymeric binder comprises isobornyl units that are capable of undergoing a deprotection reaction in the presence of photogenerated acid, used in combination with repeating units that contain phenolic groups. The polymeric binder may be a copolymer of isobornyl repeating units in combination with acrylate repeating units.

In addition, the chemically amplified photoresist composition should include a photoacid-labile group which becomes deprotected at temperatures above about 70° C. and preferably at temperatures in the range from about 110° C. to about 150° C. One example of a photoacid-labile group which becomes deprotected at temperatures within the range from about 110° C. to about 150° C. is a photoacid generator capable of generating a component selected from the group consisting of a hydrogenated sulfonic acid, a sulfonate ester compound, a disulfonate compound, a nitrobenzyl compound, and combinations thereof.

This combination of a closely packing polymeric binder and a photoacid generator which is not generally active at temperatures below about 70° C. permits the writing of a pattern over a mask surface over a long time period (exceeding 2 hours, for example) and moving and handling of the reticle prior to post exposure bake (PEB) without significant increase in the feature size from the feature size originally written onto the surface of the photoresist (by a direct write continuous wave laser, for example).

Further improvement in uniformity of feature size across the reticle surface is achieved by controlling a combination of variables during development of the printed pattern within a chemically amplified DUV photoresist. We have discovered a combination of development process variables which provide better critical dimension maintenance during development, reduction in microloading effects, and improved uniformity of critical feature dimension across the reticle surface. Development of the printed image is generally carried out using a base. Since the development process is used during fabrication of a reticle rather than in fabrication of a semiconductor device, it is possible to use a wider variety of basic developers without fear of harming adjacent materials or device features. In the Examples provided herein, the developer base is tetramethyl ammonium hydroxide (TMAH), but other bases such a potassium hydroxide (KOH), sodium hydroxide (NaOH) and sodium metasilicate ($Na_2SiO_3$) may be used, by way of example and not by way of limitation.

The reticle, including the printed photoresist is placed on a table which can be rotated and the printed pattern is developed using a spin/spray process. The developer is applied, typically by spraying from a spray nozzle, to the surface of a spinning reticle. In the Examples described herein, the reticle size was a six inch square plate. The goal is to place a large amount of developer on the surface of the photoresist, creating an in situ puddle process with constant replenishment. At a development temperature of about 30° C., in general, the more rapidly this step is accomplished, the more uniformity is achieved in the result. Although a single development cycle was used in the Examples described herein, several cycles of apply/develop may be used during a development process.

With respect to positive chemically amplified photoresists where the polymeric binder comprises repeat units which can be packed closely together to provide a highly dense structure, developer concentration has the largest effect on mean critical dimension, microloading, and uniformity. A higher developer concentration significantly helps improve uniformity of the critical dimension over the entire surface of the reticle (improves 3-Sigma). However, a lower developer concentration enables critical dimension to more nearly approach the target critical dimension, and reduces microloading. With this in mind, the concentration of tetramethyl ammonium hydroxide in a developer should range from about 0.13 normal (N) to about 0.26 N. One skilled in the art can calculate the concentration based on a comparative reactivity coefficient for a different base. Use of a surfactant in the developer helps maintain the printed critical dimension size and reduces the microloading effect when used in combination with an advantageous spin speed. Temperature of the reticle during development has only a minor effect on mean critical dimension, microloading, and uniformity when the development temperature ranges from about 10° C. to about 30° C.

DETAILED DESCRIPTION OF THE INVENTION

Figure 1:
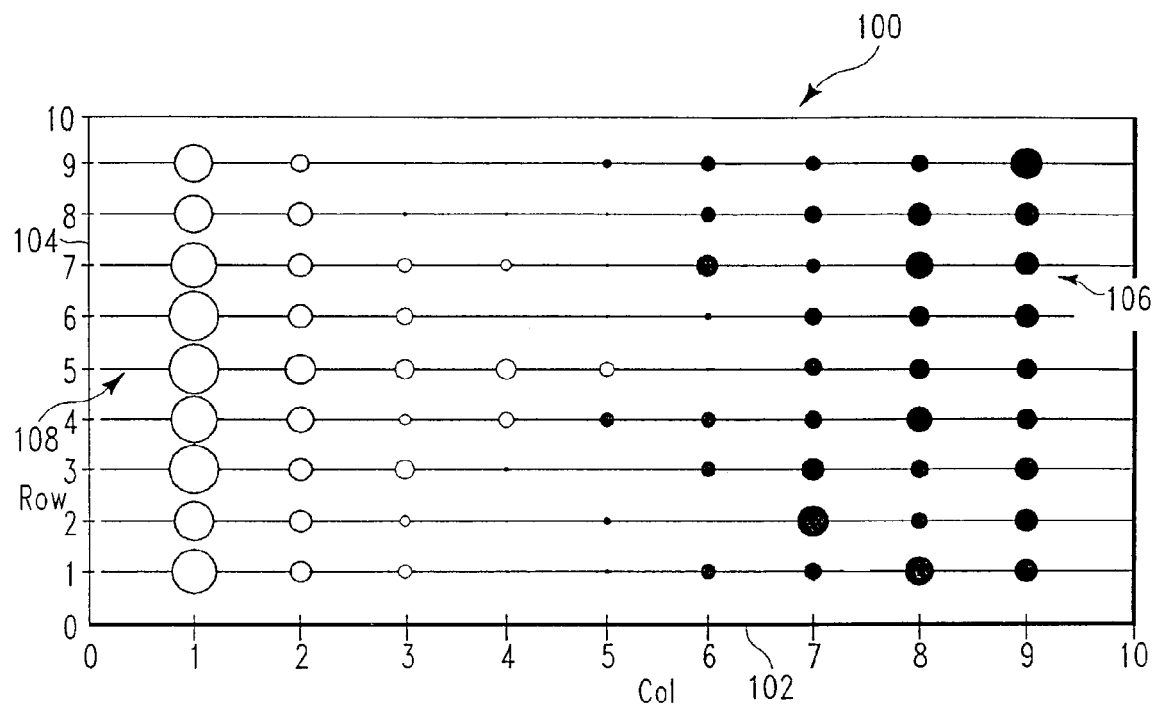
FIG. 1 shows the change in critical dimension of developed features of a patterned chemically amplified photoresist as a function of the time elapsed after printing (imaging) of the feature.

As a preface to the detailed description, it should be noted that, as used in this specification and the appended claims, the singular forms "a", "an", and "the" include plural referents, unless the context clearly dictates otherwise.

As mentioned in the Background Art section above, the present invention pertains to improving the reticle processing window in a manner which enables patterning of smaller dimension features and which enables better uniformity of features across the reticle. In particular, the invention relates to an improvement in photoresist behavior during the pattern irradiation (frequently referred to as imaging or printing) of a chemically amplified positive photoresist, and during development of the imaged photoresist to produce a patterned photoresist.

Chemically amplified photoresists are most commonly used in the production of devices on semiconductor wafers. The problems addressed in the present invention typically do not occur during the production of semiconductor wafers, because the time period during which a photoresist on the surface of a semiconductor wafer is exposed to patterning radiation is very short—typically in the range of a few seconds to a few minutes. The exposure time period is short because exposure is blanket radiation through a mask. In addition, the time between exposure of the photoresist and development of the photoresist is also very short, typically in the range of a few minutes. However, in the reticle fabrication process, since the imaging of the photoresist is carried out by a direct write process of the complicated and intricate nanometer feature size pattern, the direct writing time can range from about an hour to as long as about 24 hours, depending on the pattern and the reticle size. In addition, it is not uncommon for an imaged reticle to be stored for a time period ranging from a few hours up to two days prior to "post exposure bake" where the imaged feature size is generally "locked into" the photoresist. As a result of these time differences, a drastic change in the critical dimension of the imaged feature size from the feature size at the time of writing may occur. We discovered that this is particularly true with respect to chemically amplified photoresists.

In addition, we have investigated causes of changes in mean critical dimension of a feature, uniformity of feature size across a reticle surface, and microloading effects during development of the image within the photoresist into a pattern. Microloading effects relate to the difference between the width of a feature critical dimension developed in a loaded region and the width of a feature critical dimension developed in an unloaded region. Although microloading effects are always occurring to different degrees depending on the density of the features within a given area of the photoresist, for purposes of analysis, we considered a loaded region to be one where a clear feature which is being measured is within about 3 µm of at least one other clear feature. An unloaded region is one where the clear feature being measured is not within 3 µm of another clear feature. The proximity of the features has an effect on the development of the features since the availability of reactants and the concentration of reaction byproducts is affected by the number of features in close proximity. With respect to the Examples described subsequently herein, we were printing a cross pattern having vertical and horizontal members ranging from about 20 µm to about 50 µm. To create loaded features for comparison with unloaded features, squares were printed in the spaces formed by the 90 degree intersection of the vertical and horizontal members, so that four squares were adjacent to the vertical and horizontal members. Each square had a dimension ranging from about 20 µm to about 50 µm.

The combination of feature critical dimension changes caused by the imaging process for the pattern and by process variables in the development process must be carefully controlled, as a single mask defect typically means that the mask must be discarded. This is in contrast with a semiconductor wafer where a portion of the chips on a wafer may have to be discarded due to defect. While the yield from the wafer may be reduced, at least the entire product is not lost.

I. Apparatus Used to Write a Pattern on the Photoresist

The imaging system which was used to write a pattern on a photoresist with respect to the experimental Examples discussed herein is a direct write continuous wave laser tool, the ALTA™ 4300, available from ETEC Systems Inc., Hillsboro, Oreg. This writing tool is typically operated at 257 nm wavelength. The direct write continuous wave laser tool, available under the trade name ALTA™, is a raster-scan writing system. The system contains a polygon that rotates, reflecting 32 laser beams off each facet, and scans the beams (referred to as the brush) across the substrate. The writing quality specifications for the 257 nm ALTA™ mask writing laser tool include a minimum feature size of about 400 nm (enabling the user to realize features at 50% of specification, or 200 nm). The 257 nm ALTA™ mask writing laser tool provides the user with advanced feature critical dimension (CD) control, linearity, and uniformity. However, realization of the complete performance potential in the fabricated mask depends on the use of appropriate process materials and processing methods during fabrication of the mask.

Figure 8:
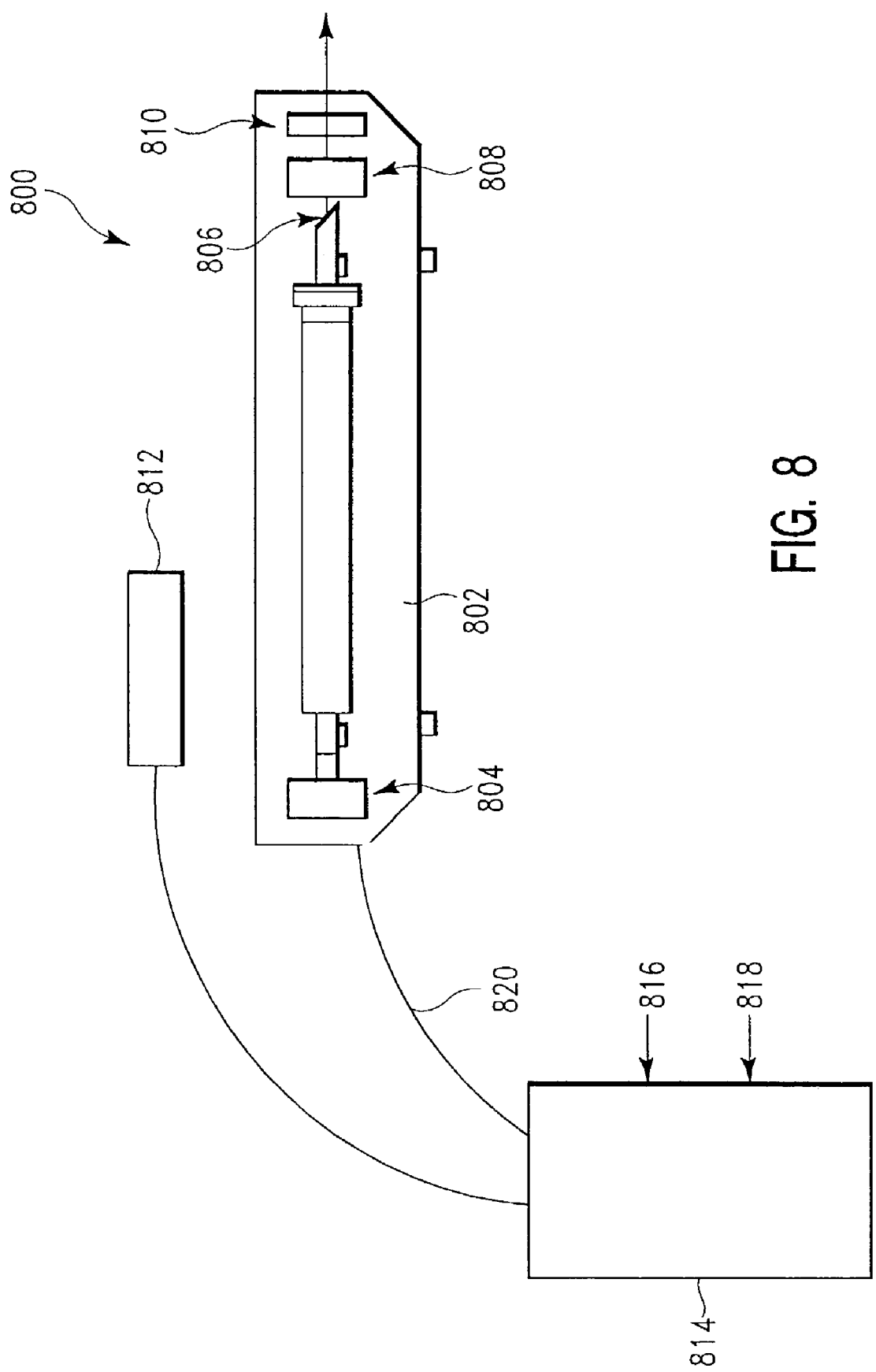
FIG. 8 shows a simplified schematic of the direct write continuous wave laser system components which were present in the tool used in writing of the pattern on the photoresists which are described in the Examples herein.

FIG. 8 shows a simplified schematic of the direct write continuous wave laser system components which were present in the tool used to image the photoresists described in the Examples which follow. The laser system 800 included the DUV laser head 802. Laser head 802 included a high reflector 804, a Brewster window 806, an output coupler 808, and a safety shutter 810. The light source was an argon-ion gas laser that is operated at a single line (514 nm) in the fundamental mode ($TEM_{00}$). This green line is then frequency doubled via an intra-cavity beta-barium borate (BBO) crystal to produce laser light at 257 nm. Due to the physics and the geometry of the doubling process, the intensity profile of the 257 nm beam is describable by a $sinc^2$ function. The side lobes of the $sinc^2$ profile are filtered to produce a predictable near-Gaussian profile beam used for printing by the ALTA™ system.

The maximum DUV output power is approximately 1.5 W. The laser is operated at lower power levels to protect optical coatings and extend the life of the laser. The laser head 802 is mounted behind a bridge (not shown) on a granite slab (not shown). As shown in FIG. 8, a remote module 812 provides control signals to a central panel 814. Further, cooling water, indicated by arrow 816 and electrical power, indicated by arrow 818, (480 V from a power distribution center not shown) are also provided to central panel 814. A laser umbilical 820 carries water, power, and the control signals to laser head 802.

Figure 9:
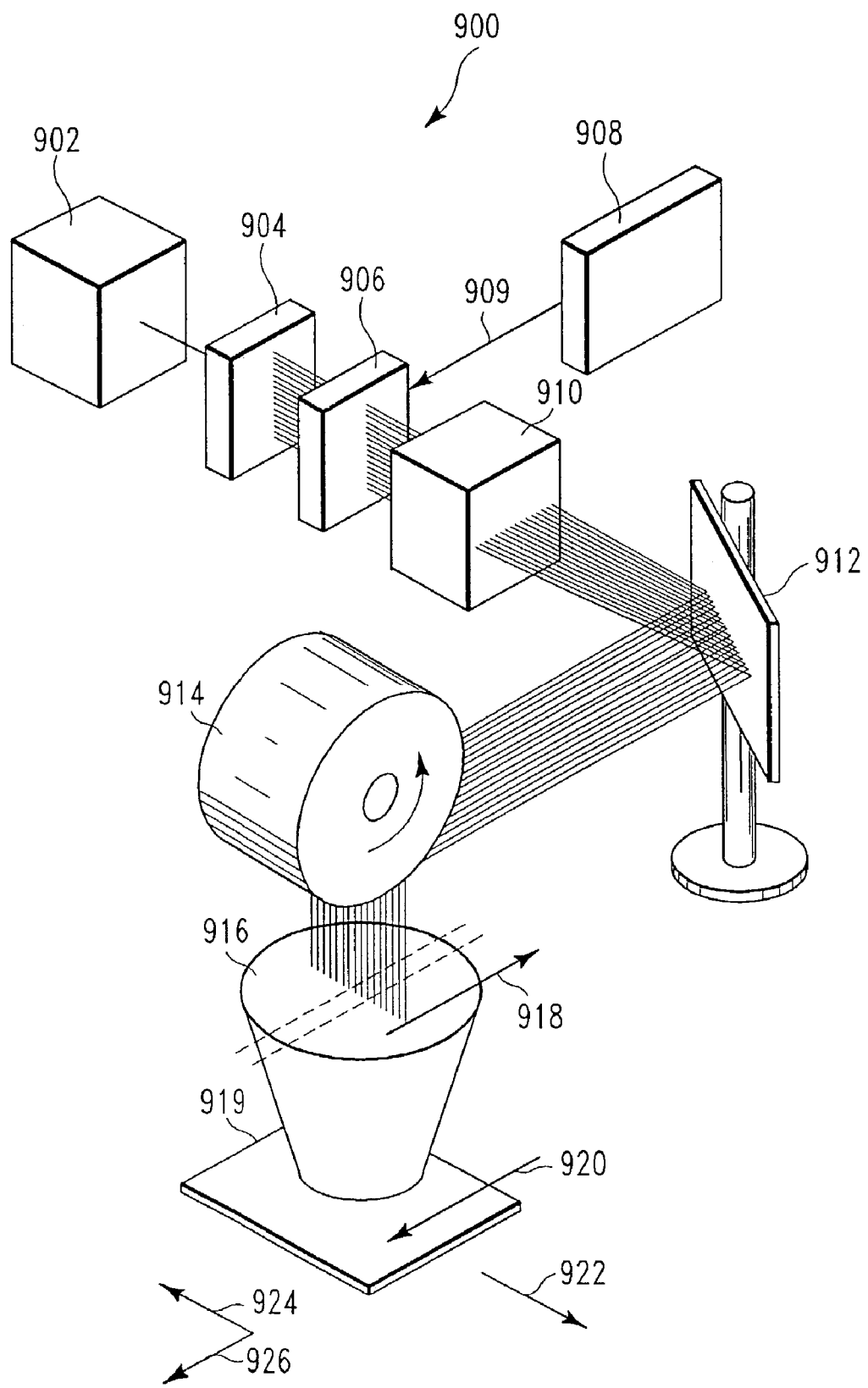
FIG. 9 shows a simplified schematic of the optical architecture of an ALTA™ 257 nm direct write continuous wave laser of the kind used to write the pattern on the photoresists which are described in the Examples herein.

FIG. 9 shows a simplified schematic of the optical architecture of an ALTA™ 257 nm direct write continuous wave laser of the kind used to image photoresists in the Examples which follow. The optical architecture 900 includes a DUV laser source 902; a multiple beam splitter 904; an acousto-optic modulator 906; geometry engines, beam boards and clock boards which present in data module 908, which provides electronic pixel data 909; a K-mirror 910; a steering mirror 912; a rotating 24 facet polygon 914; a reduction lens 916 with arrow 918 indicating scan direction before the reduction lens; and the photomask substrate plate 919, with arrow 920 indicating the scan direction at plate 919, and arrow 922 indicating the direction of plate motion. Arrow 924 indicates the stripe axis, while arrow 926 indicates the scan axis. For additional information regarding the optical architecture of the ALTA™ 257 nm direct write continuous wave laser, one skilled in the art should contact ETEC Systems of Hillsboro, Oreg.

II. Method of Patterning a Chemically Amplified Photoresist

All methods of patterning a chemically amplified photoresists may benefit from application of the present method. The method is particularly useful when the application for the photoresist is in the fabrication of a reticle, where the photoresist is imaged by a direct write process.

EXAMPLES

Example One

FIG. 1 shows a graph 100 which illustrates the problem sought to be solved by the present invention. A chemically amplified photoresist on a standard reticle plate was imaged using a 257 nm direct write laser of the type described above. The standard reticle plate included from top to bottom, a layer of a chemically amplified DUV photoresist about 5,000 Å thick, a layer of chromium oxynitride ARC about 250 Å thick, a layer of chrome mask material about 750 Å thick, and a silicon oxide-containing substrate. The pattern written onto the photoresist was a MAJx test pattern which is in the shape of crosses. The time period required to write the entire pattern was about four hours. The PEB was carried out approximately one hour after completion of the writing of the pattern. The pattern was developed using a TMAH developer available from Shipley Company, where the TMAH concentration at full strength was 0.26 N. The general development cycle included an initial developer spray nozzle purge, and a rinse and dry of the development chamber prior to each development process. The time of exposure of the photoresist to developer typically ranged from about 120 seconds to about 180 seconds, and was about 180 seconds except when noted otherwise. The rotational speed of the chuck holding the 6 inch square reticle, except when otherwise noted, was 100 rpm. The developer was applied using a fan spray nozzle positioned about 6 inches above the surface of the reticle at approximately the 11 'oclock position. The rate of application of developer typically ranged from about 250 ml/min to about 450 ml/min, and was about 250 ml/min unless indicated otherwise. In general, residence time of the developer (based on a combination of the reticle spin speed and the rate of application of developer) ranged from about 3 seconds to about 5 seconds. After application of the developer, there was a 120 second post development rinse using $CO_2$ sparged deionized water. Typically the spin speed of the chuck holding the reticle was about 800 rpm during the rinse cycle. This was followed by a spin dry cycle for about 120 seconds at about 2,000 rpm in ambient air at 30° C.

After development of the pattern in the photoresist, a measurement of a clear feature having a critical dimension size in the range of 400 nm was made at various points over the reticle plate surface. The points of measurement are defined in location by a column (Col.) number on the "X" axis 102 of the graph and by a Row number on the "Y" axis 104 of graph 100 in FIG. 1. The dark colored circles represent a positive increase in critical dimension of the feature relative to the size of the feature as originally printed. The size of a circle is related to the change in critical dimension size, with a larger circle representing a larger difference in the change from the originally printed pattern dimension. For example, dark circles 106 represent an increase in critical dimension size, while light circles 108 represent a decrease in critical dimension size. The direct writing of the pattern on the photoresist surface began at Col. 9 and ended at Col. 1. It is readily apparent that the later in the printing process that the writing occurred, the smaller the critical dimension of the developed feature. This kind of shift in critical dimension observed here due to the writing time of a feature is generally unacceptable. In this instance, the 3 Sigma variation in critical dimension is about 26 nm. The actual range of critical dimension variation was about 32 nm.

Example Two

For purposes of comparison, applicants prepared another reticle plate where the general structure was the same as described above with reference to FIG. 1, except that the photoresist was a novolak-based resist, in particular Tokyo Ohka Kogyo THMR M100. This photoresist contains a novolak binder polymer with a diazoquinone sensitizer which is cast from a 2-heptanone solvent system. The photoresist was deposited at a thickness of about 2,500 Å. This resist system does not employ chemical amplification. The imaging of the photoresist was carried out using the same direct writing tool as previously mentioned, the ALTA™ 4300 257 nm direct write continuous wave laser. The pattern was the same as described above with reference to Example One. The time required to write the pattern across the entire reticle plate surface was about three hours. The time between writing of the pattern and the PEB was about one hour. The pattern was developed using the same development process described with reference to Example One.

Figure 2:
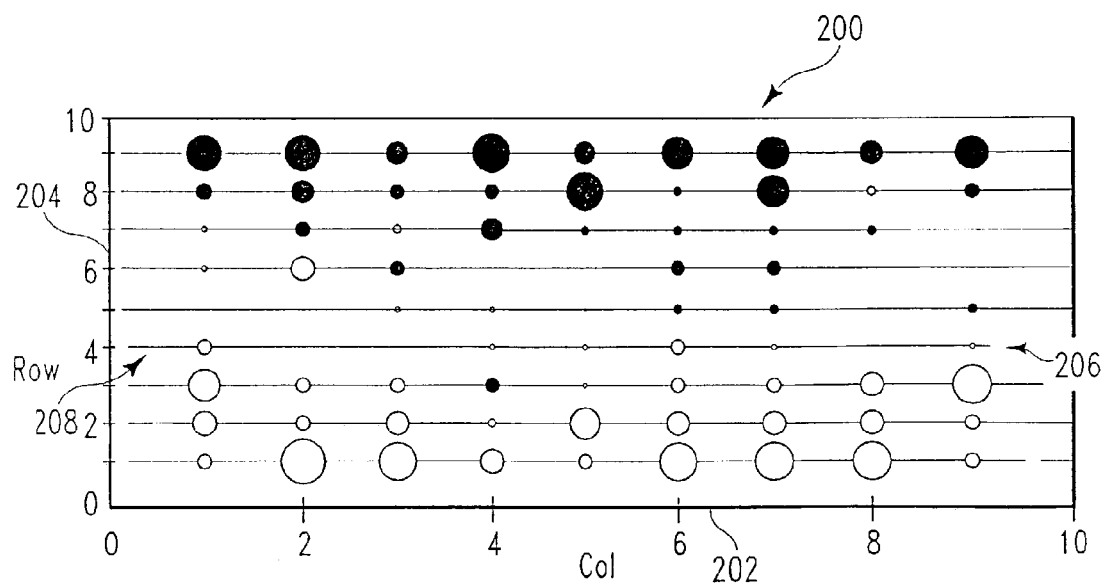
FIG. 2 shows that the functional relationship between printing time and developed feature critical dimension, which was observed for the chemically amplified photoresist illustrated in FIG. 1, does not exist for a standard non-chemically amplified photoresist such as an "I" line photoresist.

As is readily apparent from graph 200 of FIG. 2, the largest variations observed in critical dimension of the features across the reticle plate is actually within the Col. as illustrated by the row of indicators at Col. 1 in the area of arrow 208, for example. An increase in critical dimension size of the feature is evident at Row 9, with a significant decrease in critical dimension size beginning at about Row 4 and continuing through Row 1. The same sort of pattern occurs at Col. 1, as indicated in the area of arrow 206, where there is a significant increase in critical dimension size at Row, with a significant decrease in critical dimension size beginning at about Row 4 and continuing through Row 1. The writing is conducted beginning at Row 10 and progressing toward Row 1 for each column, beginning with Col. 9 and progressing toward Col. 1. This means there is a much greater time period between the writing of a feature at Col. 9/Row 9 and a feature at Col. 1/Row 9, then there is between the writing of a feature at Col. 9/Row 9, and a feature at Col. 9/Row 3. Yet, the feature sizes at Col. 9/Row 9 and at Col. 1/Row 9 both show a similar increase in size of the critical dimension of the developed feature over the initially written critical dimension. At the same time, there is a large decrease in critical dimension size between features written Col. 9/Row 9 and Col. 9/Row 3, even though the writing time is not that much different. It appears that the changes in feature size which are observed are not based on writing time.

Some of the differences between graph 100 and graph 200 are the result of differences in process variables other than writing time. However, it is clear that the trend of the critical dimension of the developed feature to increase as the writing time is increased is definitely present for a chemically amplified photoresist and not present for a non-chemically amplified novolak-based I-line photoresist.

Example Three

In order to solve the problem of sensitivity of the critical dimension to the time at which a feature is written a number of different photoresists were evaluated. During the evaluation, we discovered that we were able to significantly reduce the critical dimension variation in developed photoresist features as a function of the feature writing time by selecting a photoresist composition which provides a sufficiently dense polymeric resin binder structure to sterically hinder the movement of photoacid-labile groups, and a composition which requires a temperature in excess of about 110° C. to deprotect the photoacid-labile groups in the areas of the photoresist over which the laser exposure (writing) has occurred.

Figure 3:
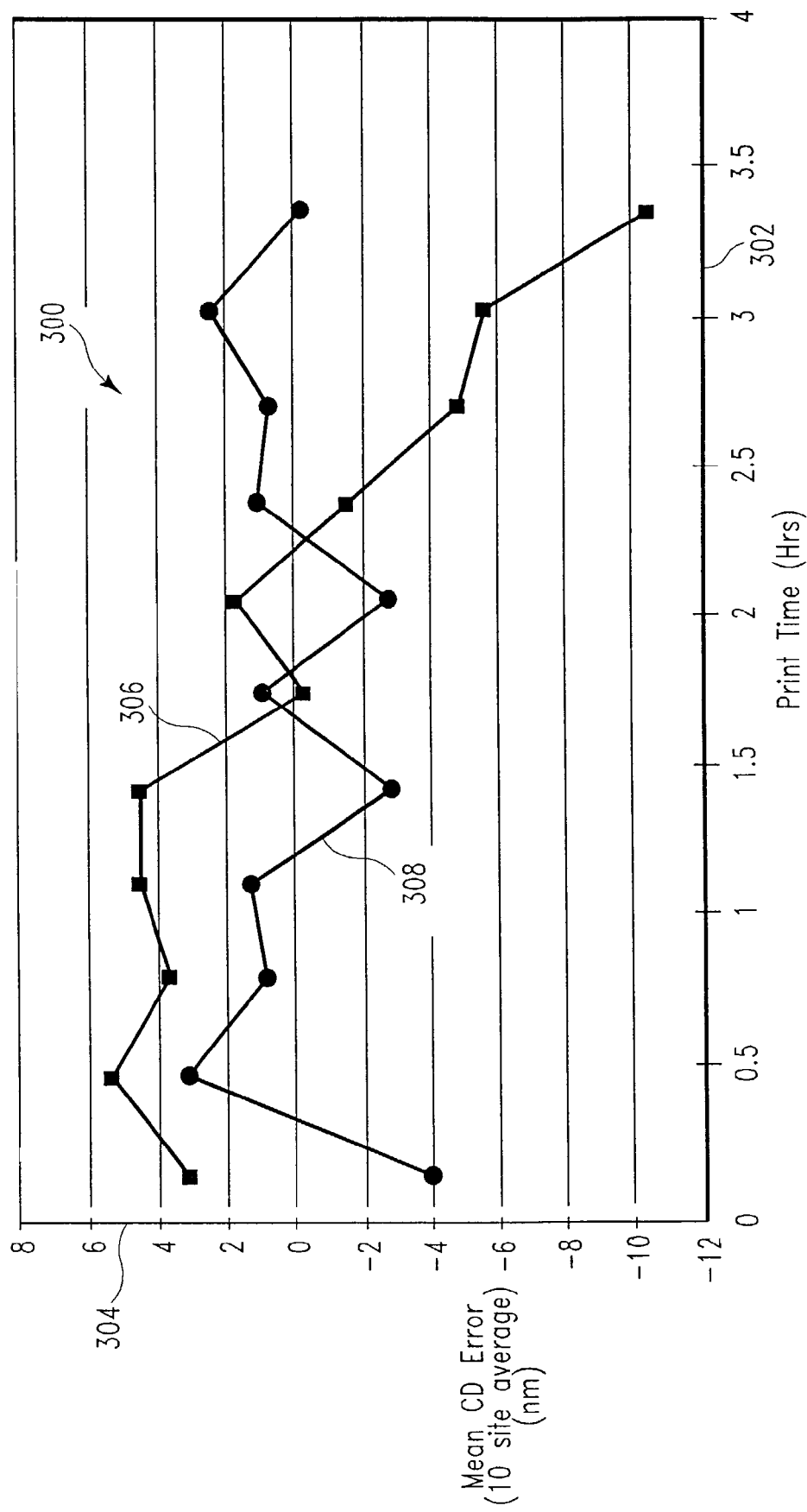
FIG. 3 shows a graph 300 of the mean critical dimension error in nm of a developed feature as a function of printing time for two different chemically amplified photoresists.

With reference to FIG. 3, comparative data is shown for a photoresist composition which has the desired characteristics and a photoresist system which is sensitive to the time over which a pattern is written. The graph 300 illustrated in FIG. 2 shows the print time in hours on the "X" axis 302 and the mean critical dimension error (10 site average) in nm. Curve 308 is representative of a photoresist which exhibits the steric hinderance described above and which provides for activation of the photoacid in the written areas of the photoresist at temperatures above about 120° C. Since the photoresist does not see a temperature of 120° during writing or during storage prior to post exposure bake (PEB), the feature critical dimensions do not change to any large extent until PEB, providing excellent control over the developed patterned photoresist pattern. In particular, the photoresist was UV6® supplied by Shipley Company of Marlborough, Mass. This photoresist includes a polymeric binder which is generally aromatic acrylic groups, and in particular is a copolymer of blocked polyhydroxy styrene with methacrylate. The photoacid-labile groups are an aromatic sulfur compound. We have also evaluated photoresists where the polymeric binder resins include meta-hydroxy styrene groups and para-hydroxystyrene groups, and find that these photoresists, when used in combination with photoacid generators which are activated at temperatures in excess of about 110° C. also perform well. For example, we have been able to reduce the average variation in local critical dimension to less than about 10 nm across a 6 inch reticle plate.

Curve 306 is representative of results obtained for a chemically amplified DUV photoresist, DX1100®, available from AZ Clariant Corp. of Somerville, N.J. The DX1100® chemically amplified photoresist was processed under the same conditions as those used in processing the UV6® photoresist. This DX1100® photoresist employs a polymeric binder which is generally a modified phenolic polymer in combination with a photoacid generator which is proprietary, but which is a chemically amplified photoacid generator such as a tosylate, mesylate, or onium salt metal halide complex. The photoacid-labile groups are activated (deprotected) at a temperature in the range of about 30° C. This, in combination with the steric hinderence properties provided by the polymeric binder causes the critical dimension which is originally written to change with time. A PEB is not required to activate the photoacid groups in the DX1100®, and these photoacid groups become active from the time writing on the photoresist occurs.

As illustrated in FIG. 3, when the pattern writing period was a 3.5 hour writing period, the mean critical dimension error for the UV6® patterned photoresist ranged from −4 nm to +3 nm, for a total range of 7 nm, while the mean critical dimension error for the DX1100® patterned photoresist ranged from −11 nm to +5.5 nm, for a total range of 16.5 nm.

Example Four

Figure 4A:
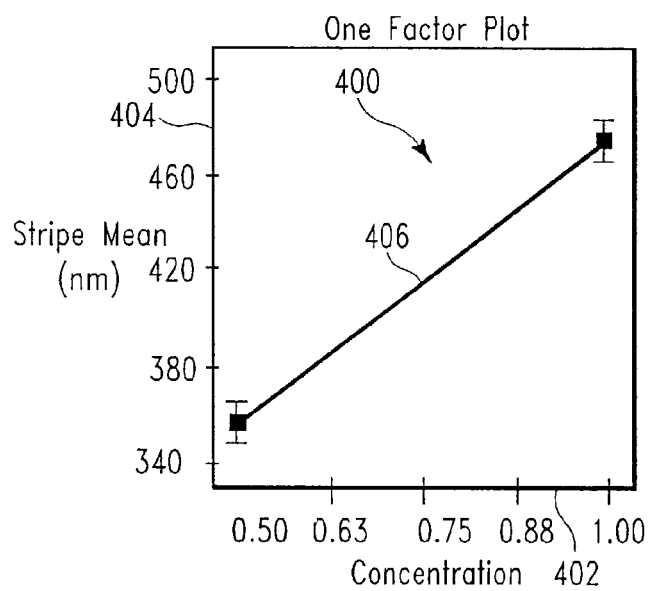
FIG. 4A shows a graph 400 which illustrates the mean critical dimension in nm of a stripe pattern feature, as a function of the concentration of the TMAH developer used to develop the printed feature.
Figure 4B:
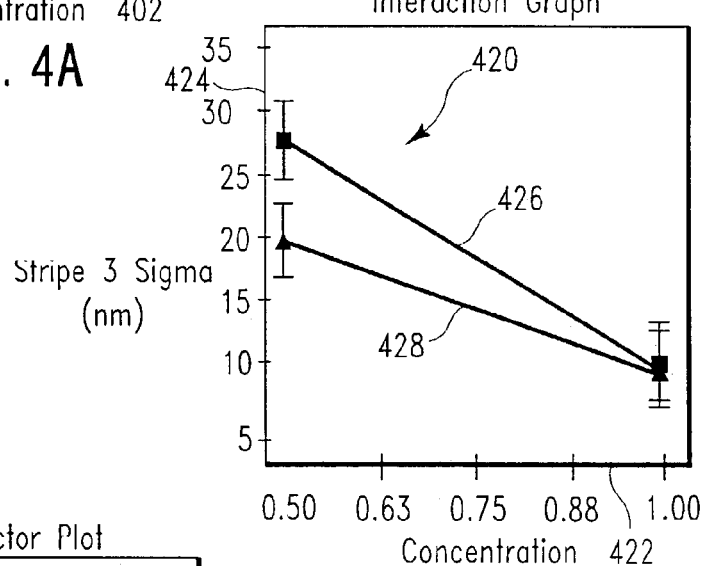
FIG. 4B shows a graph 420 which illustrates the uniformity of feature critical dimension across a reticle surface (3 Sigma variation in nm) for a developed stripe pattern feature as a function of the concentration of the TMAH developer and as a function of the temperature of the reticle during the development process.
Figure 4C:
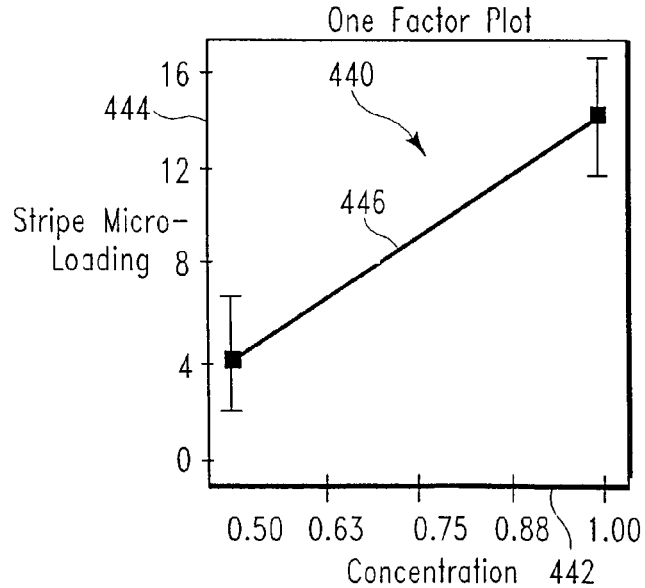
FIG. 4C shows a graph 440 which illustrates the microloading effect across a reticle surface, where microloading is the difference between the mean critical dimension in nm of a feature measured in a loaded region and the mean critical dimension of the feature measured in an unloaded region. The microloading is shown as a function of the concentration of the TMAH developer used to develop the printed feature.

Further improvement in uniformity of feature size across the reticle surface was achieved by controlling a combination of variables during development of the printed pattern within the photoresist to produce the patterned photoresist. We discovered a combination of development process variables which provide better critical dimension maintenance during development, reduction in microloading effects, and improved uniformity of critical feature dimension across the reticle surface. With reference to FIGS. 4A–4C, these figures show the effect of variations in concentration of developing agent upon the mean critical dimension, the 3-Sigma variation in critical dimension size across a reticle, and in microloading effect. The concentration of the developer is shown as the fraction of initial strength of the developer, where the initial concentration of 0.26 N TMAH is shown as 1.0. When the developer is diluted to a concentration of 0.13 N, for example, this concentration is shown as 0.5 with reference to FIGS. 4A–4C.

FIG. 4A shows a graph 400 which illustrates the mean stripe critical dimension in nm as a function of developer concentration, all other factors held constant. The mean stripe critical dimension is shown on the "Y" axis 404 and the developer concentration is shown on the "X" axis 402. The graph line 406 which represents the relationship indicates that a smaller critical dimension can be obtained when the developer concentration is lower. "Stripe" refers to the pattern which was developed, where the pattern was in the shape of a cross and the stripe refers to the vertical member of the cross. The members of the cross are equal in length and the printed length ranges from about 20 μm to about 50 μm, and the printed width of each member is in the range of about 390 to 410. The developed photoresist width critical dimension for the vertical member of the pattern is shown in nm on the "X" axis 404 of graph 400.

FIG. 4B shows a graph 420 which illustrates the uniformity of the critical dimension of the developed photoresist stripe feature across the photoresist surface area as a function of the concentration of the developer, all other factors held constant. The uniformity, in terms of 3-Sigma is shown on the "Y" axis 424 in nm, and the developer concentration, in terms of dilution of the developer (as previously described) is shown on the "X" axis 422. The graph line 426 represents the 3-Sigma value when the photoresist temperature during development was about 10° C., while the graph line 428 represents the 3-Sigma value when the photoresist temperature during development was about 30° C. It is readily apparent that at higher concentrations of photoresist, the temperature of the photoresist during development is less important than the temperature at lower concentrations.

FIG. 4C shows a graph 440 which illustrates the microloading of the stripe in the cross pattern as a function of the concentration of the developer, all other factors held constant. The microloading is shown on the "Y" axis 444 in nm, and the developer concentration, in terms of dilution of the developer) is shown on the "X" axis 442. A value of 1.0 indicates no dilution of the developer (a concentration of 0.26 TMAH), and a value of 0.5 indicates a 50% dilution. It is readily apparent that at higher concentrations of photoresist increased microloading occurs. The amount of microloading effect which can be tolerated depends on the end use application for the product which is to be produced using the finished mask. It is desired to have the microloading effect be as minimal as possible, and a microloading effect which changes the developed photoresist critical dimension by less than about 10 nm is the present target. As previously mentioned, for purposes of measuring microloading effects with respect to the cross pattern, loaded features were prepared by printing squares in the spaces between the 90 degree intersections of the vertical and horizontal members of the cross. The mean critical dimension for a developed photoresist pattern in either a loaded region or an unloaded region was determined by measuring a column of developed features in that region and determining the mean for the critical dimension in that region.

FIGS. 5A–5C and 6A–6C relate to the spin speed of the reticle during the spray/spin development of the photoresist. In particular, the developer was applied by spraying over the surface of a spinning reticle, in the manner described with respect to Example One. Typically, the more rapidly this step was accomplished, the more uniformity was achieved in the resultant critical dimension, when the temperature of the photoresist surface was in the range of about 30° C. or higher. The surface of the photoresist was then rinsed with $CO_2$-sparged, deionized water, followed by a spin dry.

Figure 5A:
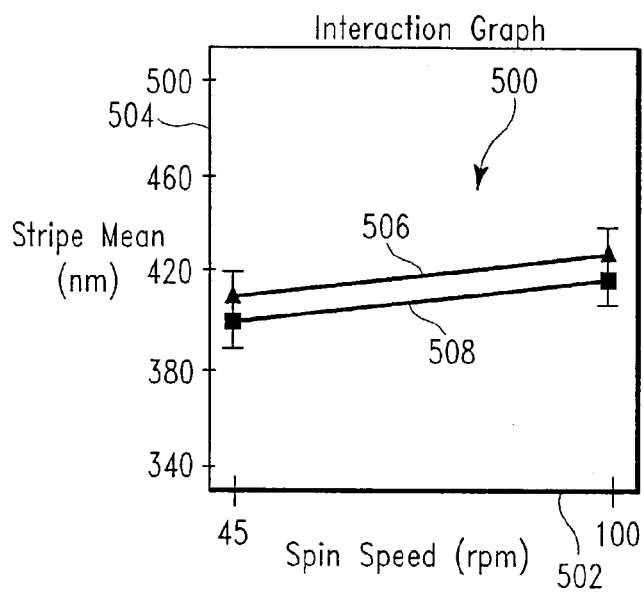
FIG. 5A shows a graph 500 which illustrates the mean critical dimension in nm of a stripe pattern feature, as a function of the spin speed of the reticle plate during development of the printed feature and as a function of the temperature during development, with all other variables held constant.

FIG. 5A shows graph 500, which illustrates the stripe mean critical dimension as a function of the spin speed, with other factors held constant. The mean stripe critical dimension is shown on the "Y" axis 504 in nm, and the spin speed of the reticle (photoresist surface) during development is shown on the "X" axis 502 in rpm. A value of 100 indicates a spin speed of 100 rpm, for example. The size of the reticle was 6 inches square. The graph line 506 is representative of the relationship when the temperature of the photoresist during development was about 30° C., while the graph line 508 is representative of the relationship when the temperature of the photoresist during development was about 10° C. Graph 500 indicates that the mean critical dimension obtained will be somewhat lower when the development temperature is lower, but that the rate of increase in mean critical dimension with increased spin speed is not affected by the development temperature.

Figure 5B:
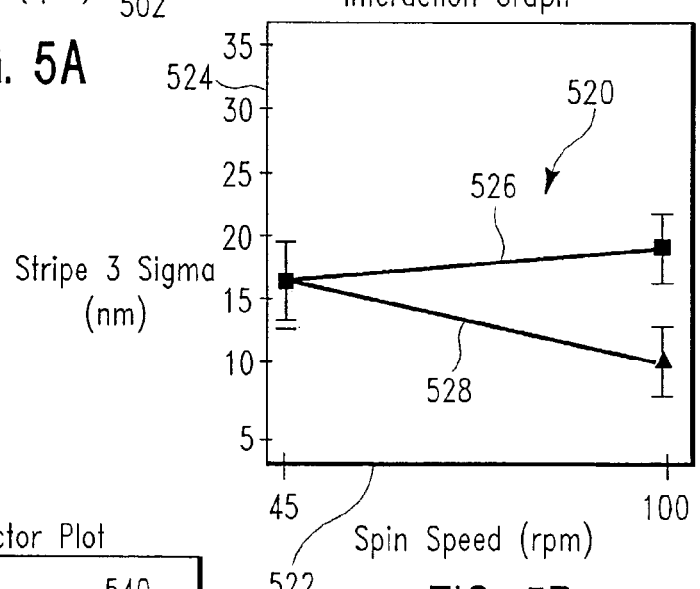
FIG. 5B is a graph 520 which illustrates the uniformity of feature critical dimension (3-Sigma in nm) across a reticle surface for a developed stripe pattern feature as a function of the spin speed of the reticle plate during development of the printed feature and as a function of the temperature during development.

FIG. 5B shows a graph 520 which illustrates the uniformity of the critical dimension of the developed feature across the photoresist surface area as a function of the spin speed, with other factors held constant. The uniformity, in terms of 3-Sigma is shown on the "Y" axis 524 in nm, and the spin speed in rpm is shown on the "X" axis 522. The graph line 526 represents the 3-Sigma value when the photoresist temperature during development was about 10° C., while the graph line 528 represents the 3-Sigma value when the photoresist temperature during development was about 30° C. It is readily apparent that when the development temperature is about 30° C., an increase in spin speed from about 45 rpm to about 100 rpm provides a significant improvement in the uniformity of development of the photoresist. However, when the development temperature is about 10° C., the uniformity of development is not improved by an increase in spin speed.

Figure 5C:
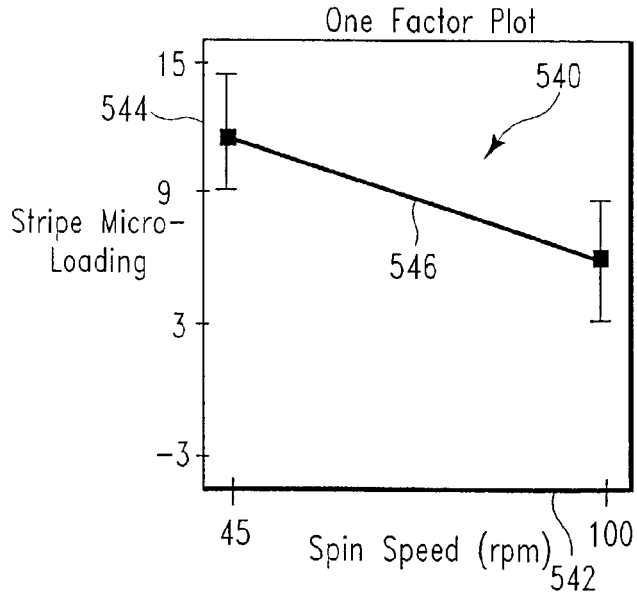
FIG. 5C is a graph 540 which illustrates the microloading effect across a reticle surface as a function of the spin speed of the reticle plate during development of the printed feature.

FIG. 5C shows a graph 540 which illustrates the microloading of the stripe in the cross pattern as a function of the spin speed during development, all other factors held constant. The microloading effect is shown on the "Y" axis 544 in nm, and the spin speed is shown on the "X" axis 542 in rpm. Graph line 546 shows the decrease in microloading effect with increasing spin speed of the chuck holding the reticle. The microloading effect is in terms of the difference in mean pattern width critical dimension between a column of features in an unloaded region and a column of features in a loaded region in the same geographical vicinity on the patterned photoresist.

Figure 6A:
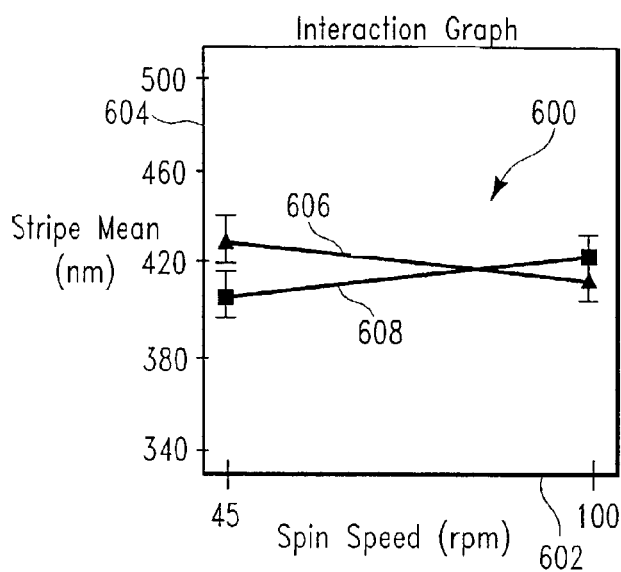
FIG. 6A is a graph 600 which illustrates the mean critical dimension in nm of a stripe pattern feature, as a function of the spin speed of the reticle plate during development of the printed feature, with and without the presence of surfactant in the TMAH developer.

FIG. 6A shows graph 600, which illustrates the stripe mean critical dimension as a function of the spin speed, with other factors held constant. The mean stripe critical dimension is shown on the "Y" axis 604 in nm, and the spin speed of the reticle (photoresist surface) during development is shown on the "X" axis 602 in rpm. The size of the reticle plate was six inches square. The graph line 606 is representative of the relationship when a surfactant (propylene glycol at a concentration of about 250 ppm) is present in the developer, while the graph line 608 is representative of the relationship when there is no surfactant present in the developer. Graph 600 indicates that the mean critical dimension obtained will be somewhat lower when no surfactant is present at spin speeds lower than about 80 rpm and slightly lower with surfactant present when the spin speeds are higher than about 80 rpm.

Figure 6B:
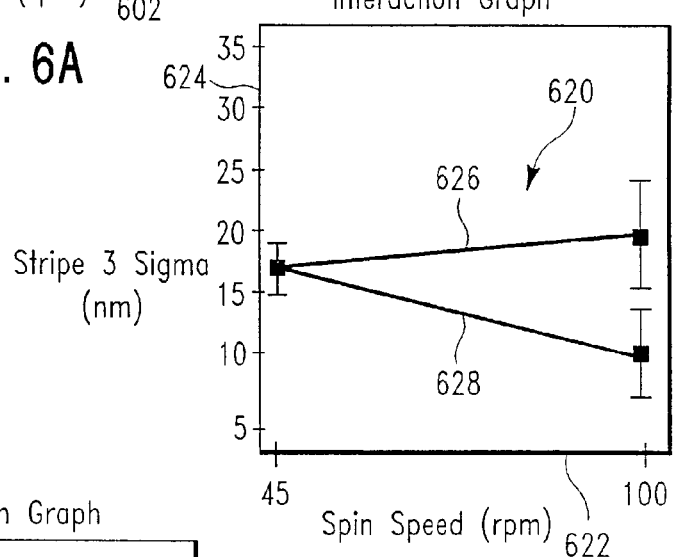
FIG. 6B is a graph 620 which illustrates the uniformity of feature critical dimension (3-Sigma in nm) across a reticle surface for a developed stripe pattern feature as a function of the spin speed of the reticle plate during development of the printed feature (without the presence of surfactant) and as a function of development temperature.

FIG. 6B shows a graph 620 which illustrates the uniformity of the critical dimension of the developed feature across the photoresist surface area as a function of the spin speed and as a function of development temperature, with other factors held constant. In this instance, the flow rate of the developer was about 335 ml/min. The uniformity, in terms of 3-Sigma is shown on the "Y" axis 624 in nm, and the spin speed in rpm is shown on the "X" axis 622. The graph line 626 shows the 3-Sigma value as a function of the spin speed rpm at a development temperature of about 10° C. and graph line 628 represents the relationship at a development temperature of about 30° C. The uniformity of development is increased with an increase in spin speed when the development temperature is 30° C., but not when the development temperature is 10° C.

Figure 6C:
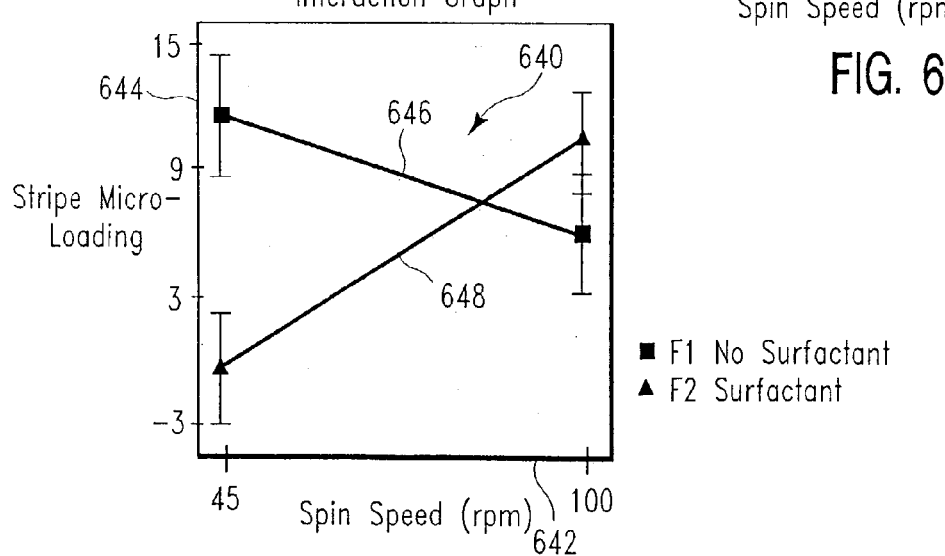
FIG. 6C is a graph 640 which illustrates the microloading effect across a reticle surface as a function of the spin speed of the reticle plate during development of the printed feature, with and without the presence of surfactant in the TMAH developer.

FIG. 6C shows a graph 640 which illustrates the microloading of the stripe in the cross pattern as a function of the spin speed during development, with other factors held constant. The microloading is shown on the "Y" axis 644 in nm, and the spin speed is shown on the "X" axis 642 in rpm. Graph line 646 represents the relationship when no surfactant is present in the developer. Graph line 648 represents the relationship when the propylene glycol surfactant is present. Clearly the microloading effect is generally reduced when surfactant is present in the developer at spin speeds below about 80 rpm. At spin speeds above about 80 rpm, there is a marginal increase in the microloading effect when surfactant is present.

Figure 7A:
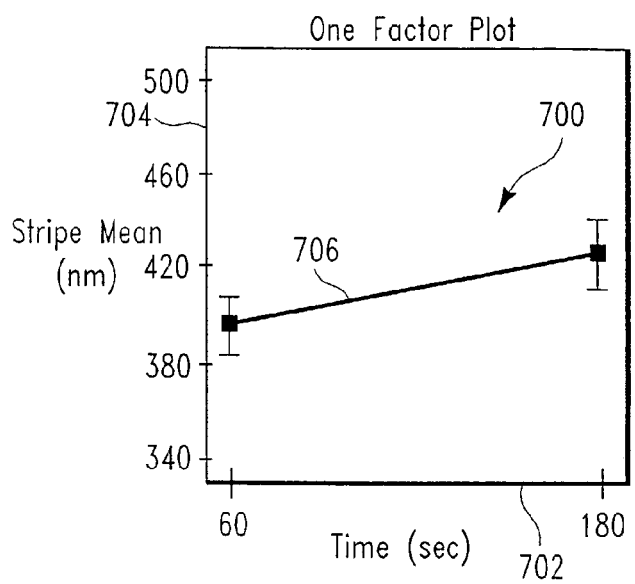
FIG. 7A is a graph 700 which illustrates the mean critical dimension in nm of a stripe pattern feature, as a function of the development time in seconds for development of the printed feature.
Figure 7B:
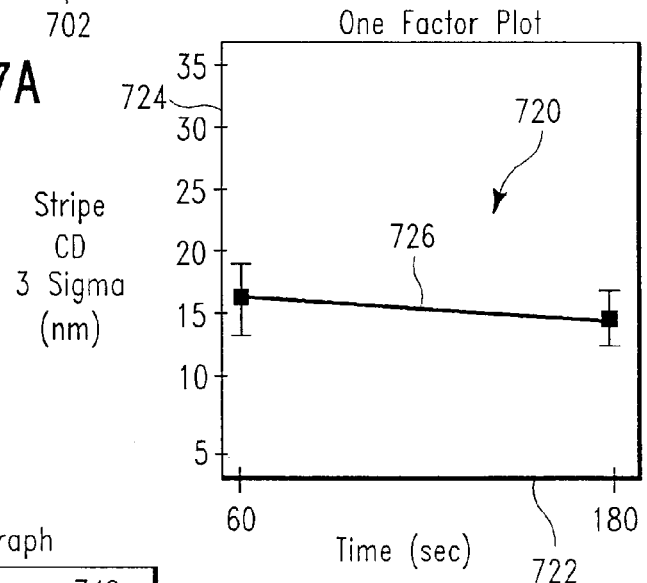
FIG. 7B is a graph 720 which illustrates the uniformity of feature critical dimension (3-Sigma in nm) across a reticle surface for a developed stripe pattern feature as a function of the development time in seconds for development of the printed feature.
Figure 7C:
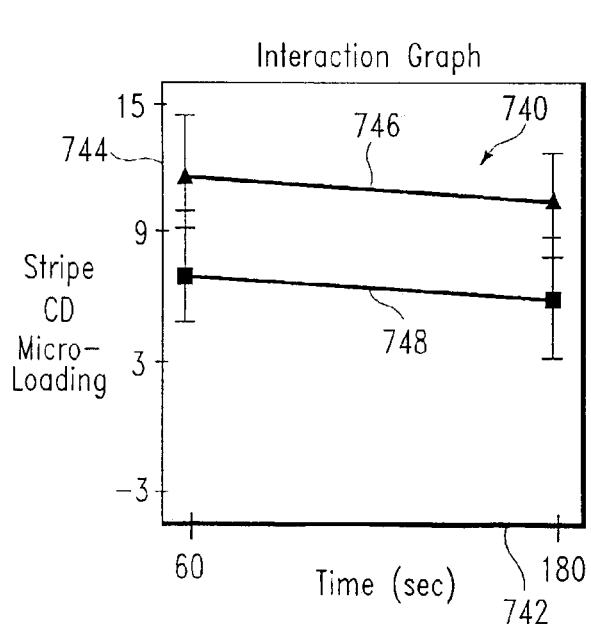
FIG. 7C is a graph 740 which illustrates the microloading effect across a reticle surface as a function of the development time in seconds for development of the printed feature, with and without the presence of surfactant in the TMAH developer.

FIGS. 7A–7C show graphs illustrating the effect of development time on the stripe mean critical dimension, the uniformity of development, and the microloading effect, respectively.

FIG. 7A shows graph 700, which illustrates the stripe mean critical dimension as a function of the development time, all other factors held constant. The mean stripe critical dimension is shown on the "Y" axis 704 in nm, and the development time is shown on the "X" axis 702 in seconds. The graph line 706 indicates that a lower stripe mean critical dimension is achieved when the development time is less.

FIG. 7B shows a graph 720 which illustrates the uniformity of the critical dimension of the developed feature across the photoresist surface area as a function of the development time, all other factors held constant. The uniformity, in terms of 3-Sigma is shown on the "Y" axis 724 in nm, and the development time is shown on the "X" axis 722 in seconds. The graph line 726 shows only a minimal decrease in the 3-Sigma value as the development time is increased.

FIG. 7C shows a graph 740 which illustrates the microloading of the stripe in the cross pattern as a function of the photoresist development time, with other factors held constant. The microloading is shown on the "Y" axis 744 in nm, and the development time is shown on the "X" axis 742 in seconds. Graph line 746 represents the relationship when the spray rate of the developer is about 250 ml/min. Graph line 748 represents the relationship when the spray rate is about 420 ml/min. Clearly the microloading effect is generally reduced when the flow rate of the developer is increased.

The above described preferred embodiments are not intended to limit the scope of the present invention, as one skilled in the art can, in view of the present disclosure, expand such embodiments to correspond with the subject matter of the invention claimed below.

We claim:

1. A method of reducing a change in critical dimension of features produced in a patterned chemically amplified DUV photoresist during fabrication of a reticle, where said change in critical dimension occurs during a direct writing of a pattern into said photoresist, said method comprising applying a photoresist composition over a surface of a reticle substrate; exposing said photoresist to a direct write radiation source during a time period of 2 hours or more, wherein said photoresist composition exhibits a sufficiently dense structure to sterically hinder a movement of activated photoacid generator groups, and wherein said photoresist composition includes photoacid-generator groups which activate to provide active photoacid at a temperature above about 70° C.; and developing said exposed photoresist to produce a patterned photoresist on said reticle substrate surface, whereby said temperature required to activate said photoacid-generator groups combined with said steric hinderence of movement of activated photoacid generator groups reduces said change in critical dimension of said features during said direct writing of said pattern into said photoresist during said reticle fabrication.

2. A method in accordance with claim 1, wherein said temperature at which said active photoacid is created is also above the temperature experienced by said photoresist subsequent to writing and prior to post exposure bake.

3. A method in accordance with claim 1, wherein said DUV photoresist includes a polymeric binder comprising repeating units selected from the group consisting of hydroxy phenyl, aromatic acrylic, photoacid-labile groups, and combinations thereof.

4. A method in accordance with claim 3, wherein said hydroxy phenyl is meta or para or ortho hydroxystyrene.

5. A method in accordance with claim 4, wherein said polymeric binder comprises meta or para or ortho hydroxystyrene units in combination with acrylate units.

6. A method in accordance with claim 3, wherein said polymeric binder includes alkyl acrylate phenol polymer.

7. A method in accordance with claim 5, wherein said polymeric binder comprises hydroxy styrene, styrene, and t-butyl acrylate.

8. A method in accordance with claim 1, wherein said DUV photoresist includes a polymeric binder comprising repeating units that contain isobornyl units that are capable of undergoing a deprotection reaction in the presence of photogenerated acid in combination with repeating units that contain phenolic groups.

9. A method in accordance with claim 8, wherein said polymeric binder includes an acrylate copolymer.

10. A method in accordance with claim 3, or claim 4, or claim 5, or claim 6 or claim 8, wherein said photoacid generator is capable of generating a component selected from the group consisting of a hydrogenated sulfonic acid, a sulfonate ester compound, a disulfonate compound, a nitrobenzyl compound, and combinations thereof.

11. A method in accordance with claim 1, wherein said photoacid generator activates at a temperature ranging from about 110° C. to about 150° C.

12. A method of fabricating a reticle, wherein a uniformity of feature size across a developed chemically amplified DUV photoresist surface is improved during fabrication of said reticle, said method including applying a photoresist composition over a surface of a reticle substrate, wherein said photoresist composition provides a sufficiently dense structure to sterically hinder a movement of activated photoacid generator groups, and wherein photoacid generator groups present in said photoresist composition activate to provide active photoacid at a temperature above about 70° C.; exposing said photoresist to a direct write radiation source during a time period of 2 hours or more; and developing said photoresist using a basic developer having a concentration of at least 0.13 normal.

13. A method in accordance with claim 12, wherein said developer concentration ranges from about 0.13 normal to about 0.26 normal.

14. A method in accordance with claim 12, wherein said developer is a tetramethyl ammonium hydroxide solution.

15. A method in accordance with claim 12, wherein development of said photoresist is carried out at a temperature in excess of about 25° C.

16. A method in accordance with claim 15, wherein said development temperature ranges from about 25° C. to about 35° C.

17. A method in accordance with claim 15, wherein the spin speed of a substrate upon which said photoresist is present during development is sufficient to generate a residence time ranging from about 3 seconds to about 5 seconds for developer applied to the surface of said photoresist by spraying.

18. A method in accordance with claim 1, wherein said photoacid generator activates at a temperature ranging from about 70° C. to about 150° C.

* * * * *